United States Patent [19]

Zeltner

[11] Patent Number: 4,912,743
[45] Date of Patent: Mar. 27, 1990

[54] ELECTRODE FOR AN ELECTRICALLY HEATED SOLDERING HEAD OF A SOLDERING MACHINE

[75] Inventor: Viktor Zeltner, Sevelen, Switzerland

[73] Assignee: Rossell Electronique S.A., Switzerland

[21] Appl. No.: 254,437

[22] Filed: Oct. 6, 1988

[51] Int. Cl.⁴ .................................................. B23K 1/02
[52] U.S. Cl. ................................ 219/85.16; 219/85.18
[58] Field of Search ........................... 219/85.16, 85.18

[56] References Cited

U.S. PATENT DOCUMENTS 4,412,123 10/1983 Ammann et al. ............. 219/85.18 X

Primary Examiner—George H. Miller, Jr.
Attorney, Agent, or Firm—Ostrolenk, Faber, Gerb & Soffen

[57] ABSTRACT

An electrode for an electrically heated soldering head of a soldering machine comprises: a current-fed resistive element for generating heat; a contacting member for contacting an article being soldered; an insulating layer effective for coupling the current-fed resistive element and the contacting member to one another such that the element and the member are thermally connected but electrically insulated from one another; and electrical connecting wires so connected as to ensure that the electrical potential on the contacting member is about equal to the electrical potential of the article being soldered.

11 Claims, 4 Drawing Sheets

ELECTRODE FOR AN ELECTRICALLY HEATED SOLDERING HEAD OF A SOLDERING MACHINE

BACKGROUND OF THE INVENTION

The present invention relates to an electrode for an electrically heated soldering head of a soldering machine.

In known stamp soldering devices, the number of electrodes that are provided depends on the nature of the structural part which is to be soldered. Current for heating the soldering surfaces is fed via a collector on the electrodes, wherein the collector serves, primarily for holding the electrodes. The electrodes are heated by brief but high currents, by means of resistance heating.

The voltage of the electrodes with respect to ground is undefined and may rise to several volts. As a result, various structural parts and conductive sections can be damaged. The problem can not be remedied by grounding the electrodes, or by connecting same to a reference potential, because such measures would result in the short-circuitry of the potential difference existing over the electrode by the grounded contact surface. Government regulations permit only very low mean voltage values (RMS), of only a few millivolts, for instance, 2 millivolts, to exist on solder surfaces of soldering heads. This requirement cannot be obtained with traditional stamp soldering apparatus.

SUMMARY OF THE INVENTION

A primary object of the present invention is to provide an electrode for an electically heated soldering head of a soldering machine the construction of which makes it possible to maintain the maximum voltages on the electrode within prescribed/regulated limits.

BRIEF DESCRIPTION OF THE DRAWINGS

The invention is described below by way of example, with reference to the drawing, in which.

DETAILED DESCRIPTION OF THE DRAWINGS

Figure 1:
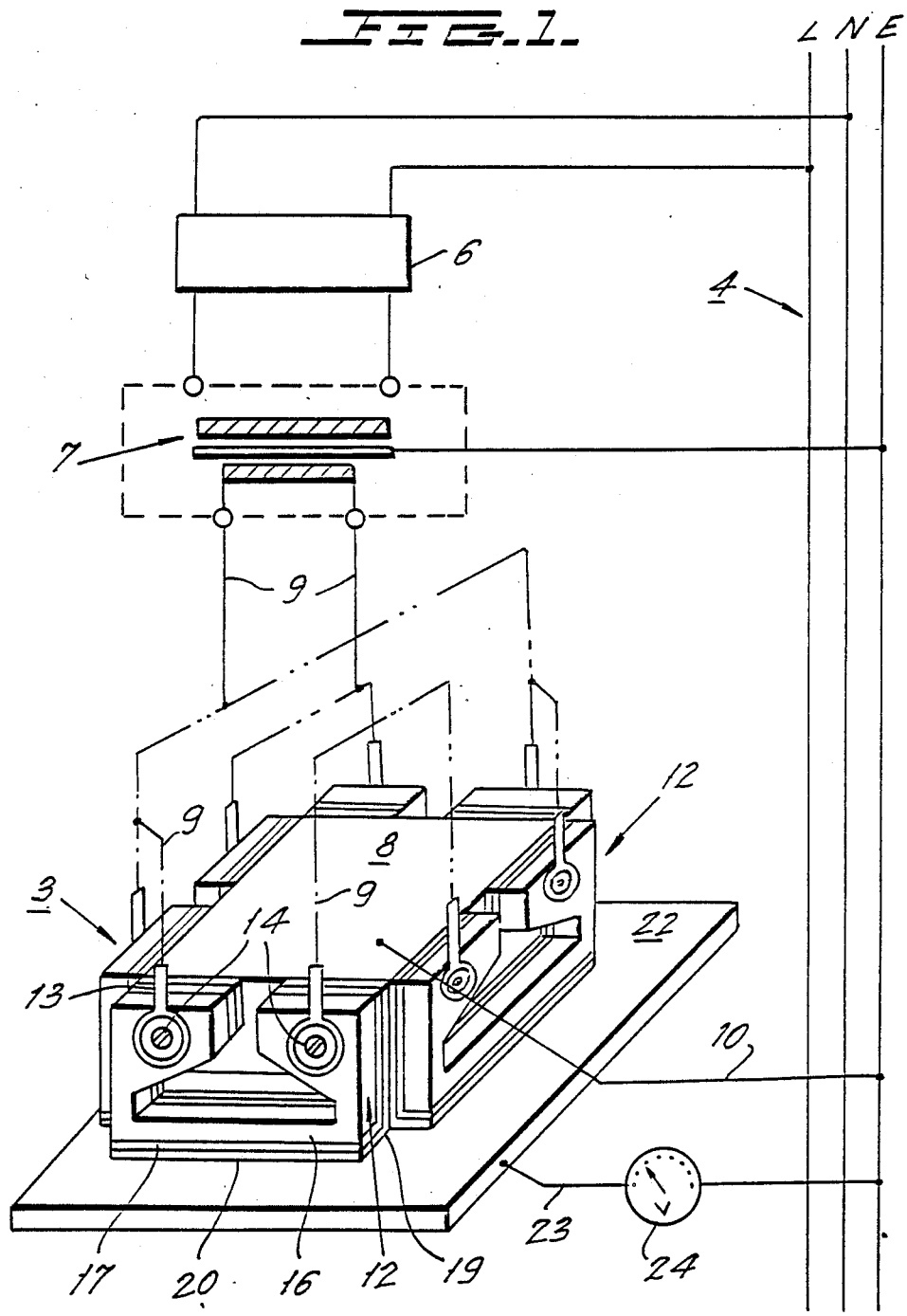
FIG. 1 is a diagrammatic perspective view of a part of a stamper soldering device.

FIG. 1 shows a portion of a soldering device 1, together with a front part 3 of a soldering head. Heating current is delivered via a current supply line 4 having a ground conductor E, a neutral conductor N and a phase conductor L. The device 1 includes control electronics 6 and a transformer 7 which is connected to the control electronics 6 and which has a primary winding which is supplied with power from the current supply line 4. The secondary of the transformer 7 extends over heating lines 9 to reach heating electrodes 12 which are held on a collector plate 8 by means of attachment bolts 14. The collector plate 8 is grounded by means of a ground line 10. The transformer may also be driven by three-phase current.

The heating lines 9 are connected in parallel (or in series) and they serve to conduct the necessary heating energy via cable shoes 13 which are connected by the attachment bolts 14 to the heating electrodes 12. The fastening bolts 14 are electrically insulated from the heating electrodes 12.

The heating electrodes 12 are formed by (see FIG. 2) a resistance heating yoke 16 which is heated by the electric current, an electric insulating material 17 which is an optimal heat conductor, and a solder contact rail 19. The rail 19 has a solder contact surface 20.

FIG. 1 shows a conductor plate 22 of a known type. Parts to be soldered are located between the plate 22 and the solder contact surfaces 20 of the solder contact rails 19. Current governmental regulations require that the plate 22, which is grounded via a grounding line 23 and a meter 24, have a voltage which does not exceed 2 millivolts (RMS). This low voltage is obtained by the electrically insulating material 17. It has been found that the solder contact rail 19 and insulating material 17 can be fabricated of different materials, i.e. as separate parts. Thus the solder contact rail 19 can consist of steel, titanium or the like. The insulation layer 17 is fabricated of ceramics, mica, teflon or similar plastic which is, for instance, vapor-deposited or sprayed onto the solder contact rail 19. It is possible to reinforce the insulating layer 17, particularly in the case where it is constructed of a layer having a very different coefficient of expansion, by means of a netting. The preferred embodiment uses ceramic material for fabricating the insulating layer 17.

Alternatively, the solder contact rail 19 is specially treated at the surface thereof which contacts the resistance heating yoke 16 with, for instance, an aluminum solder contact rail which is hard-anodized at this surface. In this case it is furthermore possible to connect the solder contact rails 19 directly to the grounded collector 8, or to ground them specially via a wire.

Figure 2:
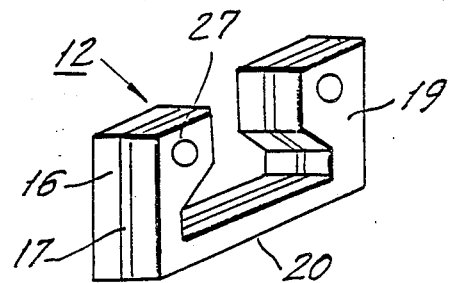
FIGS. 2-4 depict perspectively different embodiments of a heating electrode, for use in the device in accordance with FIG. 1.
Figure 3:
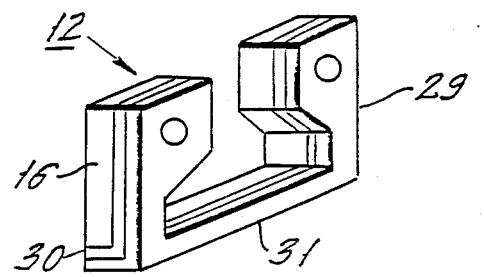
Figure 4:
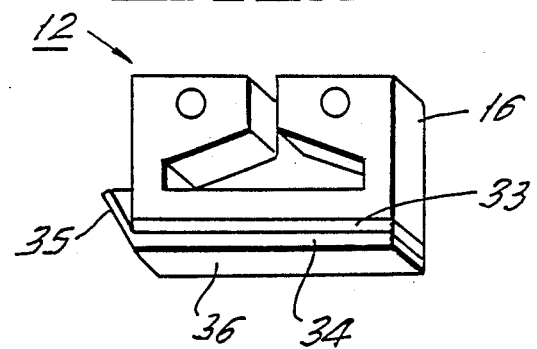

FIGS. 2 to 4 show by way of example three different embodiments of heating electrodes 12 with the corresponding resistance heating yokes 16 and the insulating layer 17 or insulations 30 and 33, as well as the solder contact rails 19 with the solder contact surfaces 20 or rails 29 and surfaces 31 or contact rails 34 with solder contact surfaces 36.

Parts which are to be soldered with a soldering machine of the present invention require the temperature on the solder contact surfaces to be hot enough for soldering. Such temperatures must be reached rapidly and must also be decreased just as rapidly after the soldering has been completed. This is achieved by using small heated masses in the soldering device. Along this line, it is also possible (see FIG. 4) to insulate the upper parts of the solder contact rail 19 of the heating electrode 12 in the region of the passages 27 which provide not only electrical but also thermal attachment points and to insulate only the lower part in the region of the solder contact surface 20 of the solder contact rail 19 electrically, but not thermally, by appropriate selection of the insulating material. The insulating material may be of such that, in addition, magnetic screening of the soldering region is necessary, for instance, by the additional use of a μ-metal.

The aforementioned insulating measures make it possible to maintain the prescribed maximum voltage of the grounded conductor plate 22.

Figure 5:
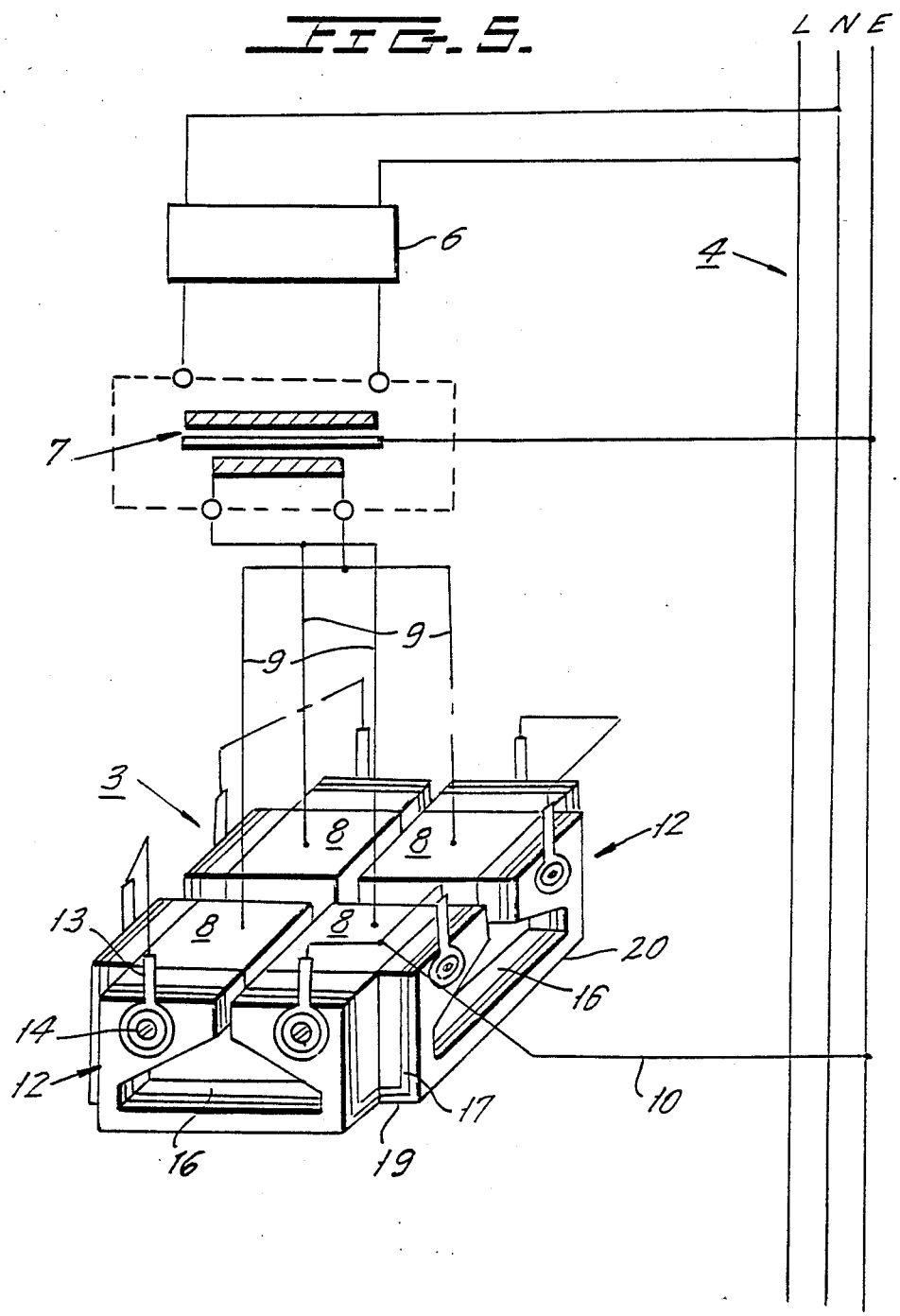
FIG. 5 is a different embodiment of a device similar to FIG. 1.

Another embodiment, similar to FIG. 1, is shown in FIG. 5. Corresponding parts bear identical reference numbers. The current connections are different and the collector plate 8 consists of four separate parts.

Figure 6:
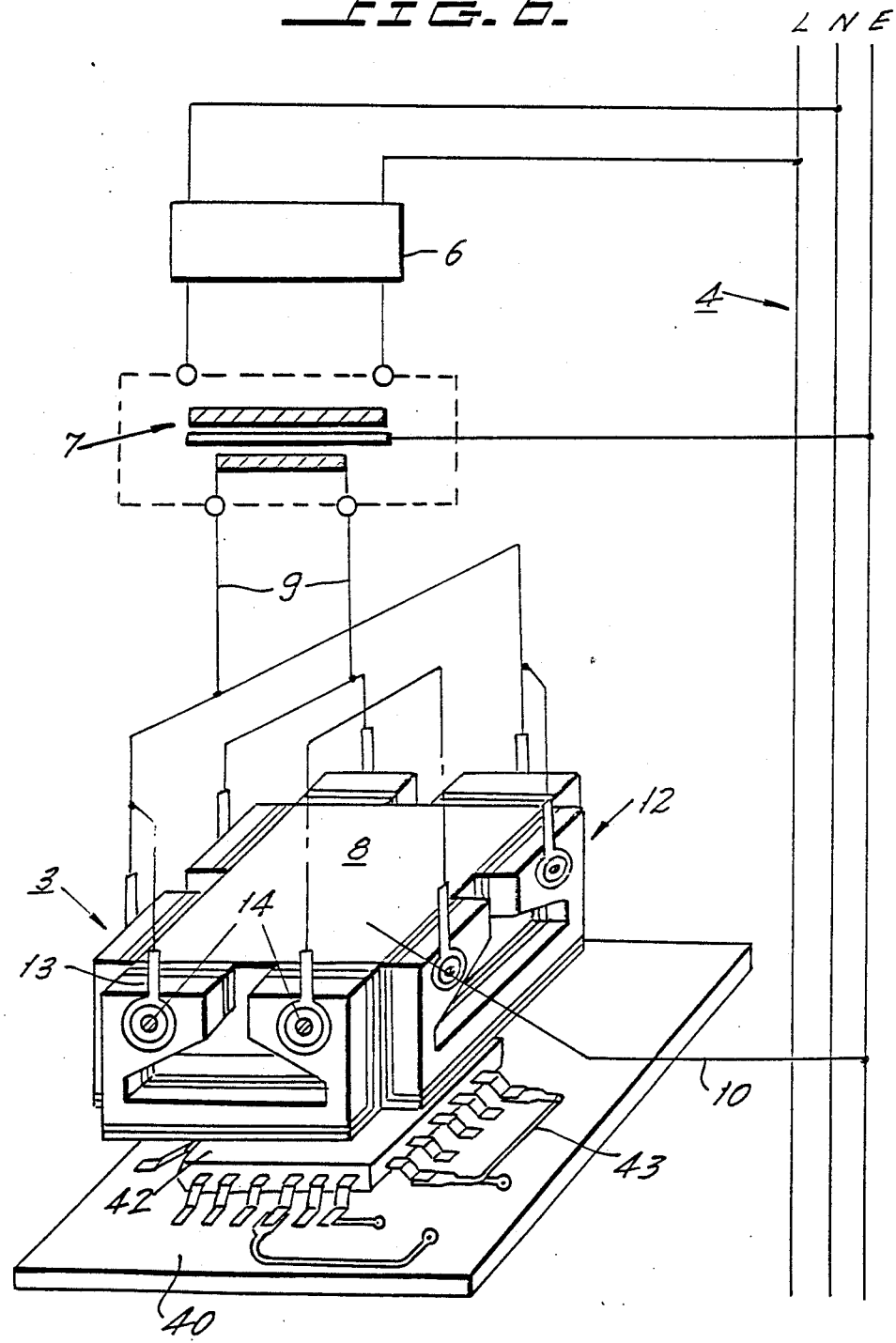
FIG. 6 illustrates the soldering device of FIG. 1 upon the soldering of an IC.

FIG. 6 shows the apparatus of FIG. 1 in an application involving the soldering of a circuit board 42 placed on a conductor plate 40. A conductor path 43 connects two contact shoes.

It would, in principle, be possible to dispense with a separate solder contact rail and effect the soldering directly with the insulating layer 17.

In these devices therefore, damage to the material being soldered by the action of electric currents is prevented.

I claim:

1. An electrode for an electrically heated soldering head of a soldering machine, the electrode comprising:
    a current-fed resistive element for generating heat;
    a contacting member for contacting an article being soldered;
    means for coupling the current-fed resistive element and the contacting member to one another such that the element and the member are thermally connected but electrically insulated from one another; and
    means for ensuring that the electrical potential on the member is about equal to the electrical potential of the article being soldered.

2. The electrode of claim 1, wherein the coupling means comprises an electrically insulating and thermally conductive layer, the contacting member having a contacting surface for contacting the article to be soldered and the contacting surface being grounded.

3. The electrode of claim 2, wherein the insulating layer is fabricated of a material selected from the group consisting of: ceramic, mica, plastic, and an adhesive having a ceramic base therein.

4. The electrode of claim 2, wherein the contacting member comprises aluminum on a surface thereof which abuts the current-fed resistive element and wherein the aluminum is hard-anodized and comprises the insulating layer.

5. The electrode of claim 2, wherein the maximum voltage on the contacting surface of the contacting member does not exceed 2 mV RMS relative to ground potential.

6. The electrode of claim 2, further comprising means for reinforcing the insulating layer.

7. The electrode of claim 6, wherein the means for reinforcing comprises a netting.

8. The electrode of claim 2, wherein the insulating layer is disposed over a predetermined region of the contacting member and further including a second insulating layer which is both thermally and electrically insulative and the second insulating layer is disposed outside the predetermined region.

9. The electrode of claim 2, wherein the insulating layer is developed through the vapor deposition of a material onto the contacting member.

10. The electrode of claim 2, wherein the insulating layer is developed by means of spraying of a material onto the contacting member.

11. A soldering head for a soldering machine, the soldering head comprising:
    a collector plate and at least one electrode mounted to the collector plate;
    the at least one electrode including:
    a current-fed resistive element for generating heat;
    a contacting member for contacting an article being soldered;
    means for coupling the current-fed resistive element and the contacting member to one another such that the element and the member are thermally connected but electrically insulated from one another; and
    means for ensuring that the electrical potential on the member is about equal to the electrical potential of the article being soldered.

* * * * *